United States Patent
Inoue

[11] 3,974,374
[45] Aug. 10, 1976

[54] DEVICE FOR POSITIONING AND PUNCHING PLATEMAKING FILMS

[76] Inventor: Yoshio Inoue, No. 10, 2 chome, Tanabehigashino-cho, Higashisumiyoshi, Osaka, Osaka, Japan

[22] Filed: Apr. 7, 1975

[21] Appl. No.: 565,523

[30] Foreign Application Priority Data
Apr. 16, 1974 Japan .................................. 49-44301

[52] U.S. Cl. ................................. 250/201; 250/202; 250/209; 356/172
[51] Int. Cl.² .......................................... G01J 1/20
[58] Field of Search ........... 250/201, 202, 561, 209, 250/548; 356/152, 171, 172

[56] References Cited
UNITED STATES PATENTS

| | | | |
|---|---|---|---|
| 3,617,751 | 11/1971 | Levy et al. | 250/201 |
| 3,657,545 | 4/1972 | Horne | 250/202 |
| 3,838,274 | 9/1974 | Doubek et al. | 250/201 |

*Primary Examiner*—Eugene La Roche
*Attorney, Agent, or Firm*—George B. Oujevolk

[57] ABSTRACT

A device is disclosed for positioning printing plates for multicolor printing and films for making such plates with respect to a punch to punch them with register holes at the same precise position. Cross marks on a film or plate are used to detect its position. The device includes a movable table on which the film or plate is taped, detectors for detecting the cross marks on the film or plate and electrically connected to motors for driving the table, and a punch mounted on the edge of the table. Responsive to the electrical signals from the detectors the motors move the table and thus the film or plate to bring the cross marks thereon into exact alignment with the detectors for accurate punching.

1 Claim, 4 Drawing Figures

DEVICE FOR POSITIONING AND PUNCHING PLATEMAKING FILMS

The present invention relates to a device for positioning films from which printing plates for multicolor printing are made and color printing plates made from such films at the same position with respect to a punch and punching them with register holes.

A cross mark for registration is generally put on the margin at each end of any original picture for multicolor printing. Such cross marks are transferred onto platemaking films for different colors made by photographing the original picture and thus color printing plates made from such films to assure registration.

It is also a practice in the printing industry to punch a plurality of register holes in platemaking films and printing plates at the same positions with respect to the cross marks. Such register holes as well as the cross marks are employed for registration, for example, in securing platemaking films to a sheet film with adhesive tape for platemaking and in mounting printing plates on a printing cylinder by locating the register holes over register pins.

A conventional method for punching a set of platemaking films with register holes is as follows: the first film is punched with holes at appropriate positions. The second film is overlaid on the first film used as a guide and carefully registered with the first one with the help of a loupe or the like to bring the cross marks thereon into exact alignment with each other. The second film thus positioned is punched with register holes at the same positions as the first film. This procedure is repeated for a required number of colors. Such a conventional punching technique not only required much skill, labor and time but also was subject to errors which would necessarily cause poor registration.

The device according to the present invention detects the cross marks on such a film or plate by means of detectors locked with respect to a punch, moves the film or plate to bring the cross marks thereon into exact alignment with the detectors, and actuates the punch to make register holes therein.

It is an object of the present invention is to provide a device which makes possible automatic punching of platemaking films and color printing plates with register holes at the same precise positions, thereby obviating the aforementioned drawbacks in the conventional punching process.

It is another object of the present invention is to provide a device which employs cross marks on platemaking films and printing plates to detect their position and move them to a correct position for precise punching.

Other objects and advantages of the present invention will become apparent from the following description of a preferred embodiment with reference to the accompanying drawings in which.

Figure 1:
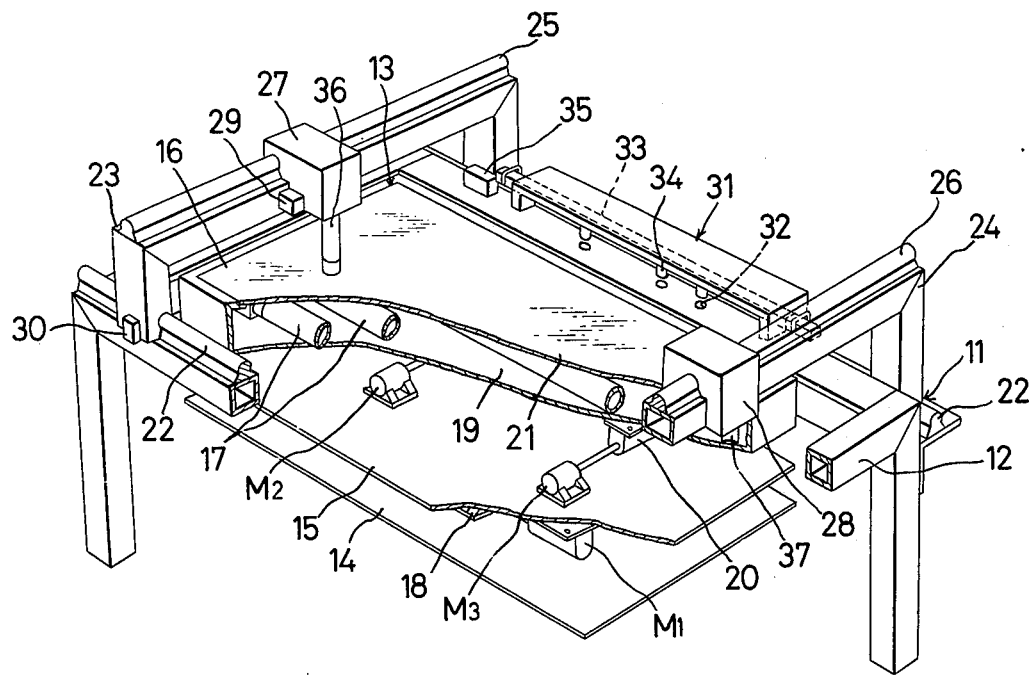
FIG. 1 is a partial cutaway perspective view of a device embodying the present invention.

Referring to FIG. 1, the numeral 11 designates a work bench which consists of frame 12 made of a suitable form of steel member and supported by four legs at their corners and a table 13 mounted thereon. The table 13 consists of a bottom plate 14 secured to the frame 12, a middle plate 15 mounted for transverse travel over the bottom plate 14, and a top housing 16 mounted to be movable in any directions over the middle plate 15. All of these three are horizontally mounted parallel to one another. Fluorescent lamps 17 are incorporated in the top housing 16.

On either the top of the bottom plate 14 or the underside of the middle plate 15 is mounted a torque motor M1 for transverse drive of the middle plate 15, and on the other, a driving mechanism of known type, such as one using a ball screw, cooperating with the motor M1 to drive the middle plate 15 in a transverse direction. Similarly, on either the top of the middle plate 15 or the underside 19 of the top housing 16 are mounted torque motors M2 and M3 with their output shafts directed in a longitudinal direction, and on the other, two driving mechanisms 20, similar to the driving mechanism 18, which cooperate with the motors M2 and M3 to move the top housing 16 in a longitudinal direction.

Rotation of the motors M2 and M3 in the same direction at an equal speed causes longitudinal travel of the top housing 16. Rotation of one motor only or that of both motors but in different directions also causes it to be turned in a horizontal plane. Transverse travel of the middle plate 15 combined with longitudinal travel and turning of the top housing 16 enables the latter to be moved in any direction. A milk sheet glass is used as the top plate 21 of the top housing 16 to permit upward transmission of the light from the fluorescent lamps 17 housed therein.

On the front and rear edges of the frame 12 are mounted rails 22 therealong parallel to each other. Bridging over the table 13, two gate-shaped movable frames 23 and 24 are mounted on the work bench 11 to slide transversely on the rails 22. On the moving frames 23 and 24 are mounted longitudinal rails 25 and 26, respectively.

The carriages 27 and 28 each are provided with a lock 29, which uses an electromagnet, for example, to lock them to their respective movable frames 23 and 24 at a desired position. When energized, the lock 29 operates to lock the carriage 27 and 28 relative to the movable frame 23 and 24. Similarly, the movable frames 23 and 24 also are provided with a lock 30 to lock them with respect to the frame 12 in position.

A punch 31 is mounted on the frame 12 on the rear edge thereof. The punch 31 includes a plurality of rod-receiving holes 32 therealong arranged in the rear edge of the frame 12, a lever 33 provided with a plurality of rods 34 and mounted for up-and-down movement so that the rods 34 come into and out of the rod-receiving holes 32, and an electromagnet 35 actuating the lever 33. When actuated by the electromagnet 35, the lever 33 lowers to punch a film or plate which has been precisely positioned.

Detectors 36 and 37 are carried by the carriages 27 and 28, respectively, so as to project downwardly from the bottom of the latter. The detectors 36 and 37 can be freely moved horizontally by means of their respective movable frames and carriages to over the cross marks 39 on the film 38. A photoelectric element is incorporated in each detector. The detector 36 at left-hand side of FIG. 1 provides for detection of both longitudinal and transverse positions of the film whereas the detector 37 at its right-hand side provides for detection of its longitudinal position only.

Figure 2:
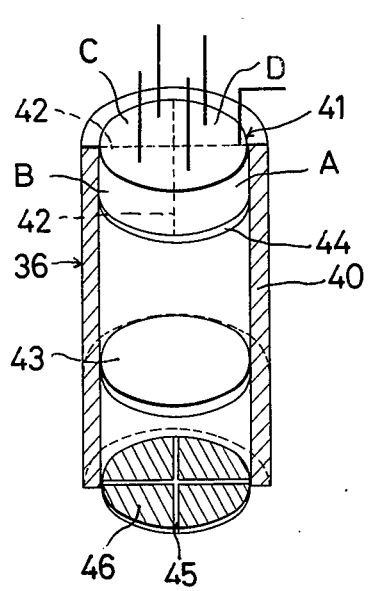
FIG. 2 is a perspective view, in longitudinal section, of one of the detectors employed in the device.
Figure 3:
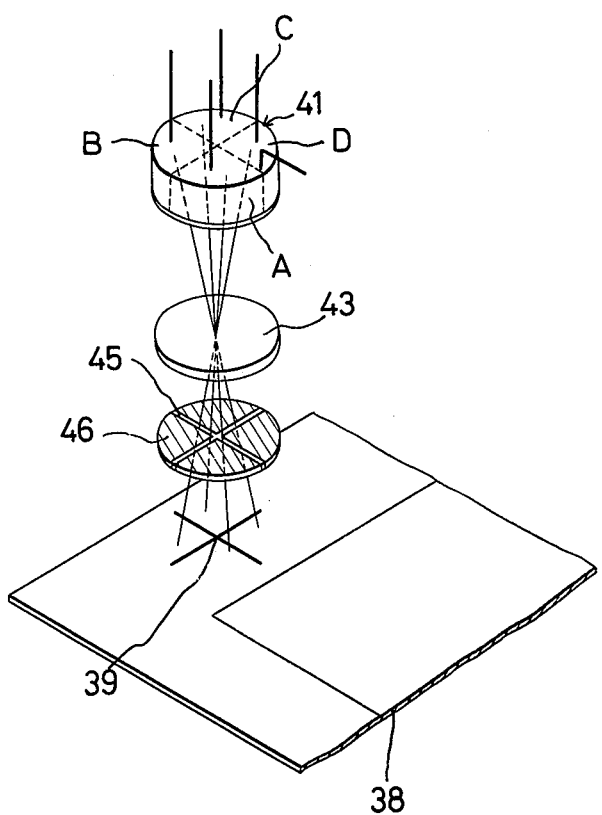
FIG. 3 is a diagrammatic view showing how a cross mark on the film is detected by the detector of FIG. 3.

The construction of the left-hand detector 36 is shown in FIG. 2. A tubular body 40 is fixed to the carriage 27 to project downwardly from the bottom thereof. In the tubular body 40 is incorporated a photoelectric element 41 at the top thereof. The photoelectric element 41 is equally divided by cross hairs 42 into four light-receiving sections A, B, C and D which are electrically independent of one another. The detector 36 is secured to the carriage 27 so that the cross hairs 42 on the photoelectric element 41 may be in parallel alignment with the longitudinal and transverse axes of the table 13, respectively. A magnifying lens 43 is incorporated in the tubular body 40 halfway of its length.

Cross marks 39 on the transparent platemaking film 38 are opaque and have a thickness of the order of 0.1 mm. When the film 38 is laid on the table 13 and the fluorescent lamps 17 are put on, the light therefrom is transmitted through the film 38 except at the cross marks 39. Thus the transmitted light carries an optical image of the cross marks 39. Also, the cross hairs 42 on the photoelectric element 41 have a thickness of the order of 0.2 mm and the lens 43 has a magnification factor of ×2 or ×3.

The relationship in position between the cross mark 39 on one end of the film 38 and the cross hairs 42 is one of the following three: the former is in alignment with the latter, is misaligned therewith in a longitudinal and/or transverse direction, or aligned therewith center-to-center but differs therefrom in angular position.

First, if the cross mark 39 is in exact alignment with the cross hairs 42, the optical image of the cross mark 39 is enlarged by the lens 43 so as to overlap the cross hairs 42 so that an equivalent amount of light falls upon the light-receiving sections A, B, C and D. Since the electrical output from each light-receiving section depends on the amount of light incident on it, these sections give an equivalent amount of output when such an exact alignment is established.

Secondly, if the cross mark 39 is slightly misaligned with the cross hairs 42 in a longitudinal and/or transverse direction, the light-receiving sections A, B, C and D receive different amounts of light, thus giving different outputs.

Thirdly, if the cross mark 39 is aligned with the cross hairs 42 center-to-center but differs from the latter in angular position, the lights incident on any of the sections are partially interrupted by the cross mark 39 but to the same extent. Thus, all the sections receive an equivalent amount of light and produce an equivalent output.

The lower portion of the tubular body 40 of the detector 36 is green in color and transparent to enable the operator to see through and easily bring the detector 36 into alignment with the cross mark 39. A red filter 44 is mounted in the tubular body 40 beneath the photoelectric element 41 to cancel the light incident thereinto through the green transparent portion, thus preventing it from interfering with detection.

A mask 46 provided with a transparent cross 45 may be attached to the bottom of the tubular body 40 so that the cross 45 is aligned with the cross hairs 42. The transparent cross 45 may be of a relatively large thickness to further facilitate the positioning of the detector 36 into alignment with the cross mark 39. If the mask 46 is provided, the amount of light falling on the photoelectric element 41 is greatly reduced, but the operation of the device according to the present invention remains substantially the same whether the mask 46 is provided or not.

The other detector 37 at right-hand side of FIG. 1 is of the same construction as the above-mentioned detector 36 except that the former has a photoelectric element 47 equally divided by a horizontal bar 48 into two (not four) light-receiving sections E and F electrically independent of each other. The detector 37 is fixed to the carriage 28 so that the horizontal bar 48 on its photoelectric element 47 may be in parallel alignment with the transverse axis of the table 13. The detector 37 serves to detect any longitudinal displacement from the horizontal bar 48 of the cross mark 39. When the horizontal bar 48 is in alignment with the horizontal line of the cross mark 39, the light-receiving sections E and F give an equivalent output irrespective of whether or not the horizontal bar 48 is aligned center-to-center with the cross mark 39, since the lights incident on them are interrupted by the vertical line of the cross mark 39 to the same extent.

Figure 4:
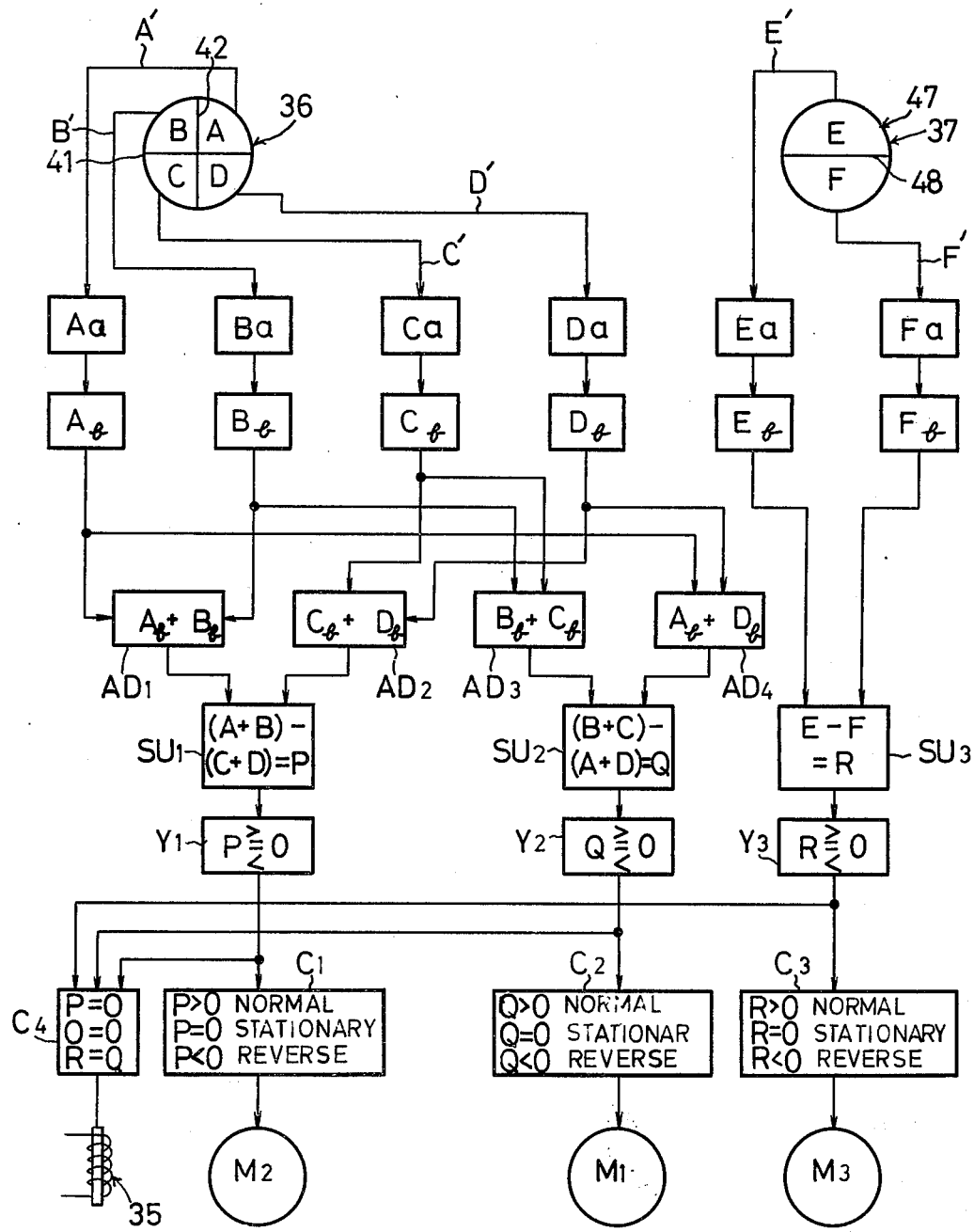
FIG. 4 is a block diagram of a control circuit used in the device.

The control circuit (FIG. 4) will now be explained which connects the detectors 36 and 37 with the torque motors M1, M2 and M3.

The light-receiving sections A, B, C and D of the photoelectric element 41 in the detector 36 are connected by lead wires A', B', C' and D' to voltage amplifiers A$a$, B$a$, C$a$ and D$a$, the output of which are fed to analog-digital converters A$b$, B$b$, C$b$ and D$b$. Adders AD1, AD2, AD3 and AD4 are connected to add the digital outputs of converters A$b$ and B$b$, those of C$b$ and D$b$, those of B$b$ and C$b$, and those of A$b$ and D$b$, respectively.

The light-receiving sections E and F of the photoelectric element 47 in the other detector 37 are connected by lead wires E' and F' to the voltage amplifiers E$a$ and F$a$ which in turn are connected to analog-digital converters E$b$ and F$b$.

SU1, SU2 and SU3 designate subtractors; SU1 subtracts the output of the adder AD2 from that of AD1, SU2 the output of the adder AD4 from that of AD3, and SU3 the output of the converter F$b$ from that of E$b$, respectively.

Y1, Y2 and Y3 at the next stage designate discriminating circuits which discriminate whether the outputs of subtractors SU1, SU2 and SU3 are larger or smaller than, or equal to, zero, and give a command for normal or reverse rotation or stoppage to motor controllers C1, C2 and C3 according to the result of discrimination, respectively.

The motor controllers C1, C2 and C3 are connected to motors M2, M1 and M3, respectively. The motor controllers C1 and C2 drive the motors M2 and M1, respectively, according to the result of computation of outputs from the detector 36. The motor M1 imparts to the table 13 transverse movement through the middle plate 15 and the motor M2 does a longitudinal movement to the left-hand portion of the table 13. Likewise, the motor M3 serves for the other detector 37 and imparts to the table 13 a longitudinal movement at its right-hand side.

The outputs of the discriminating circuits Y1, Y2 and Y3 are also connected to an electromagnetic controller C4 which is connected to the electromagnetic 35. Only when the outputs of all the discriminating circuits become zero, the controller C4 actuates the punch 31 through the electromagnet 35 to punch holes through the film 38.

Although in the preferred embodiment the device according to the present invention is applied for the punching of a platemaking film, it can also be used to punch printing plates for multicolor printing. But, illumination from under by fluorescent lamps in the top housing is naturally unsuitable for printing plates since they are usually opaque. In punching a printing plate, therefore, only the cross marks thereon are made unreflecting as by coloring and light is projected onto the plate from lamps arranged over the table. The light reflected from the plate produces an optical image similar to the one in the case of films to permit detection for positioning.

The device according to the present invention is of the aforementioned construction. The operation thereof will now be explained.

The first platemaking film 38 is placed on the table 13 with its upper margin (where register holes are to be made) under the punch 31 and the cross marks 39 at both sides. The film 38 is temporarily taped to the table 13 in this condition.

The movable frames 23 and 24 and the carriages 27 and 28 thereon are then moved by hand in transverse and longitudinal directions, respectively, to bring the detectors 36 and 37 into an approximate alignment with the cross mark 39 at each side of the film 38 as possible. Fine position adjustment of the detectors 36 and 37 is further made manually by visual observation so that the cross hairs 42 and the horizontal bar 48 are aligned as correctly as possible with the left-hand cross mark 39 and the horizontal bar of the right-hand one 39, respectively. After positioning, the locks 29 and 30 are activated to lock the movable frames 23 and 24 and the carriages 27 and 28 in position. The position of the detectors 36 and 37 are now fixed with respect to the punch 31.

Detection for positioning of the film is then started by pressing a start button, for example. The light from the fluorescent lamps 17 incorporated in the table 13 passes through the film 38 and strikes on the photoelectric element in each detector. When passing through the film 38, the light is interrupted only at the cross marks 39 thereon so that their optical images are formed. The images are enlarged by the lens 43 and projected to the photoelectric elements 41 and 47.

On the detector 36, if the optical image of the cross mark 39 just falls on the cross hairs 42 on the photoelectric element 41, the light-receiving sections A, B, C and D will receive an equivalent amount of light, thus producing an equivalent output as described above. The result of subtraction and thus the outputs of the discriminating circuits Y1 and Y2 become zero so that the motors M1 and M2 are not energized.

Likewise, if the optical image of horizontal line of the cross mark 39 just falls on the horizontal bar 48 of the photoelectric element 47 on the other detector 37, the light-receiving sections E and F receive an equivalent amount of light, thus giving an equivalent output. Because of zero output from the discriminating circuit Y3, the motor M3 is not energized to move the table 13.

If the cross hairs 42 and the horizontal bar 48 are accurately aligned with the cross marks 39 as mentioned above, P, Q and R will become zero and the controller C4 energize the electromagnet 35 to actuate the punch 31, which operates to make register holes through the film 38.

If the cross hairs 42 are not precisely aligned with the respective cross marks 39, the light-receiving sections A, B, C and D of the detector 36 receive different amounts of light, thus producing different outputs. The output voltages therefrom are fed to the amplifiers A$a$, B$a$, C$a$ and D$a$ and then to the converters A$b$, B$b$, C$b$ and D$b$ for analog-to-digital conversion. The outputs of the converters A$b$ and B$b$ are fed to the adder AD1, those of C$b$ and D$b$ to AD2, those of B$b$ and C$b$ to AD3, and those of A$b$ and D$b$ to AD4 for digital addition. The outputs of the adders AD1 and AD2 are then inputted to the subtractor SU1, and those of AD3 and AD4 to SU2 for the following subtraction:

$$P = (A + B) - (C + D)$$
$$Q = (B + C) - (A + D)$$

Likewise, the outputs of the light-receiving sections E and F of the other detector 37 are fed to the subtractor SU3 through the amplifiers E$a$ and F$a$ and the analog-digital converters E$b$ and F$b$, respectively, for the following subtraction:

$$R = E - F$$

The difference signals P, Q and R are inputted to the discriminating circuits Y1, Y2 and Y3 to discriminate whether they are larger or smaller than, or equal to, zero. If they are larger than zero, the motor controllers C1, C2 and C3 cause the motors M2, M1 and M3 to rotate in a normal direction, respectively. If they are smaller than zero, C1, C2 and C3 cause their respective motors to rotate in a reverse direction. As soon as each of them becomes zero, the motor will be stopped.

As described above, the amounts of lights incident on the light-receiving sections of the photoelectric elements 41 and 47 are transformed into electrical signals and the motors M2 and M3 for longitudinal travel and M1 for transverse travel are driven in normal or reverse direction responsive to the electrical signals to move the film 38 on the table 13 to such a position that P, Q and R all become zero, namely, where the cross hairs 42 and the horizontal bar 48 are accurately aligned with the cross marks 39 on the film 38, respectively.

At the instant when P, Q and R all become zero, the electromagnet controller C4 actuates the punch 31 to make register holes in the film 38. The film thus punched is removed from the table 13 and the next film is placed thereon. From the second film on, with the detectors left locked, the film is placed on the table 13 so that the cross marks thereon come just under the detectors. The above-mentioned procedure is repeated for subsequent films. This arrangement ensures that all the films for different colors are punched with register holes at the same precise positions.

By detecting the cross marks on films by means of detectors with the latter fixed relative to the punch, all the films or printing plates in a particular set can be brought to the same position with respect to the punch for accurate punching. The device according to the present invention permits automatic punching of platemaking films and color printing plates with register holes without the help of a loupe or the like and without any positioning error, thereby greatly increasing accuracy and efficiency in multicolor printing.

It is further understood by those skilled in the art that the foregoing description is a preferred embodiment of the disclosed device and that various changes and modifications may be made in the invention without departing from the spirit and scope thereof.

What is claimed is:

1. A device for positioning platemaking films or the like for use in multicolor printing, comprising a movable table for placing thereon a film to be positioned having a plurality of register marks thereon, a plurality of means for driving said movable table in both longitudinal and transverse directions, two detecting means mounted to be movable over said table and lockable at a desired position for detecting the position of the film, a photoelectric element mounted in said each detector and equally divided with cross-hairs into a plurality of light-receiving sections electrically independent of one another for transforming the amount of light incident on said each light-receiving section thereof into an electrical signal, a means for producing optical images of said register marks so as to project said optical images onto said photoelectric elements in the detectors, and a means for electrically connecting said photoelectric elements to said table driving means to drive the latter responsive to said electrical signals, whereby moving the film so that the electrical signals from said light-receiving sections of each detecting means become equal to one another.

* * * * *